United States Patent [19]

Yonezawa

[11] Patent Number: 5,241,176

[45] Date of Patent: *Aug. 31, 1993

[54] SCANNING ELECTRON BEAM MICROSCOPE WITH HIGH RESOLUTION AT LOW ACCELERATING VOLTAGE

[75] Inventor: Akira Yonezawa, Tokyo, Japan

[73] Assignee: Seiko Instruments Inc., Tokyo, Japan

[*] Notice: The portion of the term of this patent subsequent to Jun. 11, 2008 has been disclaimed.

[21] Appl. No.: 800,357

[22] Filed: Dec. 2, 1991

[30] Foreign Application Priority Data

Nov. 30, 1990 [JP] Japan ................... 2-339753

[51] Int. Cl.[5] ............................................. H01J 37/14
[52] U.S. Cl. ............................. 250/310; 250/396 ML
[58] Field of Search ............. 250/310, 396 R, 396 ML

[56] References Cited

U.S. PATENT DOCUMENTS

| | | | |
|---|---|---|---|
| 4,306,149 | 12/1981 | Le Poole et al. | 250/311 |
| 4,785,176 | 11/1988 | Frosien et al. | 250/396 ML |
| 4,999,496 | 3/1991 | Shaw et al. | 250/310 |
| 5,023,457 | 6/1991 | Yonezawa | 250/396 ML |
| 5,045,705 | 9/1991 | Mollenstedt | 250/398 |
| 5,079,428 | 1/1992 | Da Lin et al. | 250/396 ML |

*Primary Examiner*—Jack I. Berman
*Assistant Examiner*—Jim Beyer
*Attorney, Agent, or Firm*—Spensley Horn Jubas & Lubitz

[57] ABSTRACT

An electron beam device having a single pole electromagnetic objective lens whose pole top face is positioned in front of a sample as viewed from the side of an electron beam source. A secondary electron detector is provided in the vicinity of the pole top face of an inner cylinder of the objective lens. The objective lens has a circular cylindrical or conical shape at the top of the objective lens and the vertical angle of the circular cylindrical or conical shape is 45°–90°. The working distance between the top of the objective lens and sample is less than 6 mm. It is possible to survey the sample with a resolving power corresponding to a dimension about one-half that of the prior art under low accelerating voltage conditions.

4 Claims, 9 Drawing Sheets

SCANNING ELECTRON BEAM MICROSCOPE WITH HIGH RESOLUTION AT LOW ACCELERATING VOLTAGE

BACKGROUND OF THE INVENTION

This invention relates to an electron beam device capable of high-resolution survey, or observation, of a semiconductor wafer under low acceleration conditions.

In the field of development and production of semiconductors, improved scanning electron microscopes (SEM) have been demanded which can survey the line width and the like of a pattern provided on a large-size wafer using a low accelerating voltage with high resolution.

Figure 2:
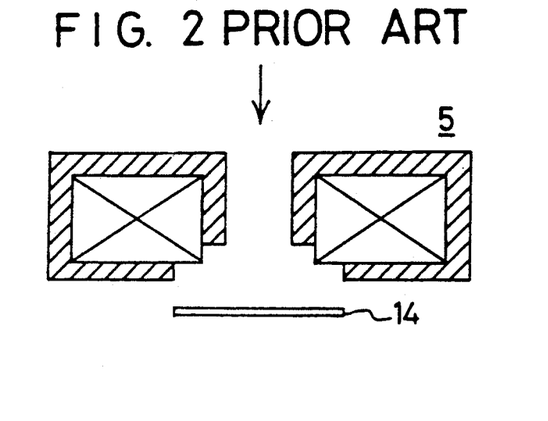
FIG. 2 is a sectional view showing a conventional objective lens of a scanning electron microscope of low accelerating voltage.

In view of such circumstances, a conventional SEM uses an objective lens as shown in FIG. 2 (see The 132nd Committee of Application of Charged Particle Beam to Industry, 1989, page 159). This SEM can survey and measure a large-size semiconductor wafer using an accelerating voltage of 1 KV with a resolution of as fine as 8 nm.

However, such a degree of resolution as above is not sufficient nowadays because the degree of integration of super LSI circuitry has been increased to significantly decrease the line width and the like of a pattern.

Referring to FIG. 2, it would be proposed to enhance the resolving power by positioning a sample closer to the objective lens and increasing the magnetomotive force of the lens to decrease the aberration coefficient of the lens. However, since the top face of an inner cylinder is retracted from the end face of an outer cylinder toward an electron beam source, a large-size sample can hardly be positioned closer to the inner cylinder of the objective lens, and since the top face of the inner cylinder is not miniaturized, the focusing magnetomotive force of the lens increases as the sample is caused to approach the inner cylinder; consequently, the conclusion is that the resolving power can hardly be enhanced by the foregoing provision.

Under the prediction that the degree of integration of super LSI circuitry will increase, it is desirable to make it possible to survey and measure a large-size wafer using a low accelerating voltage with higher resolution.

SUMMARY OF THE INVENTION

In view of the foregoing desire, it is an object of the present invention to provide an electron beam device including a single-pole electromagnetic lens as an objective lens whose arrangement, configuration and intensity are properly set.

Other and further objects, features and advantages of the invention will appear more fully from the following description.

To accomplish the foregoing object, the present invention provides an electron beam device having a single-pole electromagnetic objective lens whose pole top face is positioned in front of a sample as viewed from the side of an electron beam source, characterized in that a secondary-electron detector is provided in the vicinity of the pole top face of an inner cylinder of the objective lens; a base portion of the inner cylinder of the objective lens is circular in cross section and the base portion and the pole top face defined at the distal end of the inner cylinder are connected together by a cylindrical or conical intermediate portion; the diameter $D_o$ of the pole top face of the inner cylinder of the objective lens and the diameter $D_c$ of a circle formed between the base portion and the conical or cylindrical intermediate surface satisfy the relationship: $D_o < 25$ mm $< D_c$; the angle $\theta$ between the pole top face and the conical or cylindrical intermediate surface of the objective lens satisfies the relationship: $45° \leq \theta \leq 90°$; the pole face of an outer cylinder surrounding the inner cylinder is arranged midway between the sample and a point spaced 50 mm from the pole top face of the inner cylinder toward the electron beam source in the direction of optical axis; the distance (working distance) W between the sample and the pole top face satisfies the relationship $W \leq 6$ mm; and for W and an accelerating voltage U, the focusing magnetomotive force $J/\sqrt{U}$ for focusing a bundle of electron beams on the sample satisfies the relationship: $7.1(D_o/W) + 2.2 \leq J/\sqrt{U} \leq \{7.1 \cdot (D_o/W) + 2.2\} \times \{0.29(D_c/D_o - 1) + 1\}$ [AT/V$^{\frac{1}{2}}$].

The electron beam device may be modified such that the periphery of the base portion of the inner cylinder of the objective lens is tapered as to be continuous with the conical intermediate portion.

The electron beam device may be modified such that another inclined surface is provided between the conical intermediate portion and the pole top face of the inner cylinder of the objective lens whose inclination angle is smaller than that of the conical intermediate surface.

In general, the resolving power of a scanning electron microscope of low accelerating voltage is dependent on the intensity of its electron source and the chromatic aberration of its objective lens.

Figure 3:
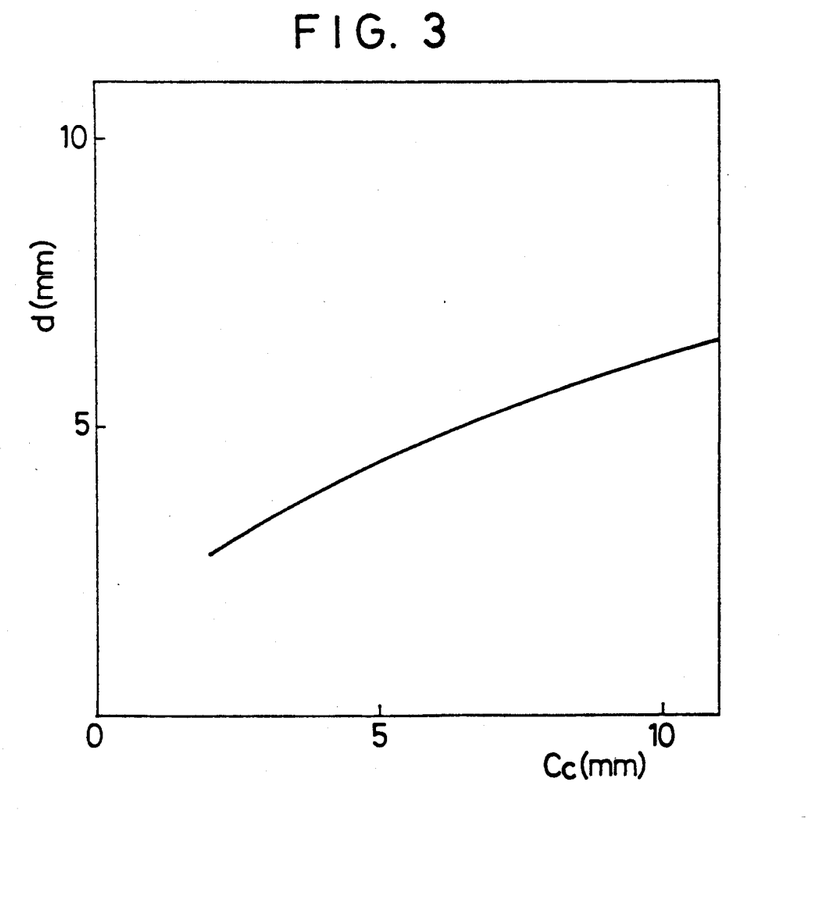
FIG. 3 is a characteristic diagram showing the relationship between resolving power d and chromatic aberration coefficient $C_c$ at an accelerating voltage of 1 KV.

The relationship between the resolving power d and the chromatic aberration coefficient $C_c$ at an accelerating voltage of 1 KV where a field-emission electron gun is used as the electron source is obtained as shown in FIG. 3 in accordance with the wave-optical theoretical formula introduced by Crew et al. It will be clear that the resolving power should be made smaller than 4 mm at an accelerating voltage of 1 KV.

Figure 4:
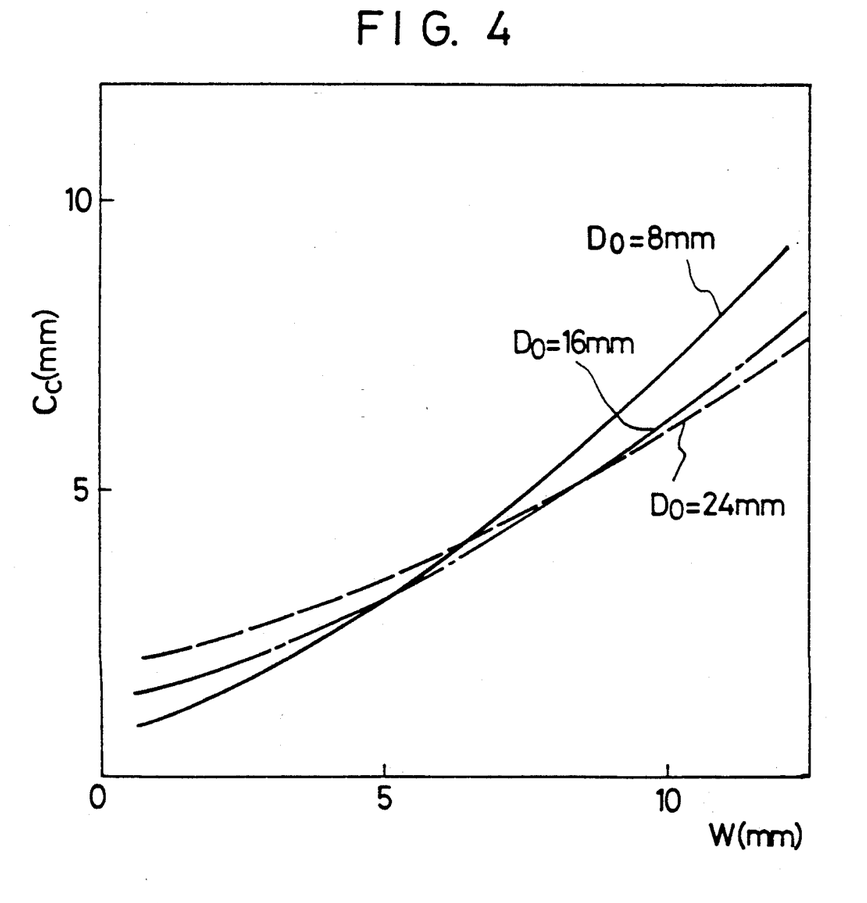
FIG. 4 is a characteristic diagram showing the relationship between working distance W and chromatic aberration coefficient $C_c$ where the top face diameter $D_o$ of a single-pole lens is selected as a parameter.

FIG. 4 shows the relationship between the working distance W and the chromatic aberration coefficient with the top face diameter $D_o$ of the single-pole lens selected as a parameter. The $C_c$ can be obtained from the magnetic distribution of the lens in accordance with the known integral formula. As will be appreciated from FIG. 4, to keep $C_c$ below 4 mm, W must be no larger than 6 mm.

Figure 5:
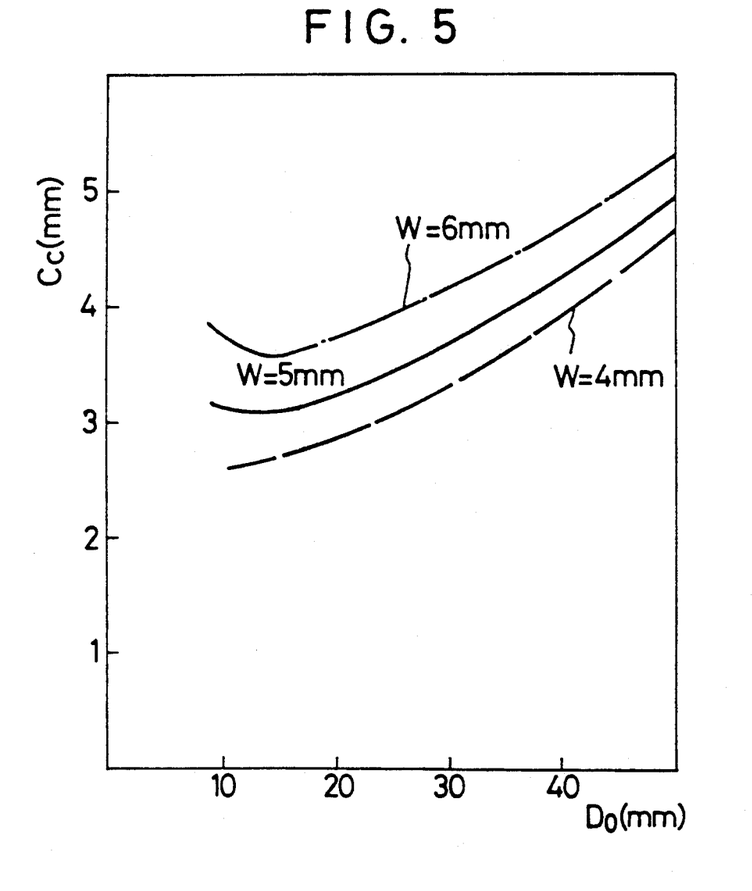
FIG. 5 is a characteristic diagram showing the relationship between top face diameter $D_o$ of the single-Pole lens and chromatic aberration coefficient $C_c$ where the working distance W is selected as a parameter.

FIG. 5 shows $C_c$ in relation to $D_o$. As will be appreciated where W is 6 mm and $D_o$ is about 25 mm, $C_c$ becomes larger than 4 mm. Where W is smaller than 6 mm, even if $D_o$ is larger than 25 mm, $C_c$ can be made smaller than 4 mm. However, as will be described later, the magnetomotive force then increases; thus, this provision is unfeasible.

Figure 6:
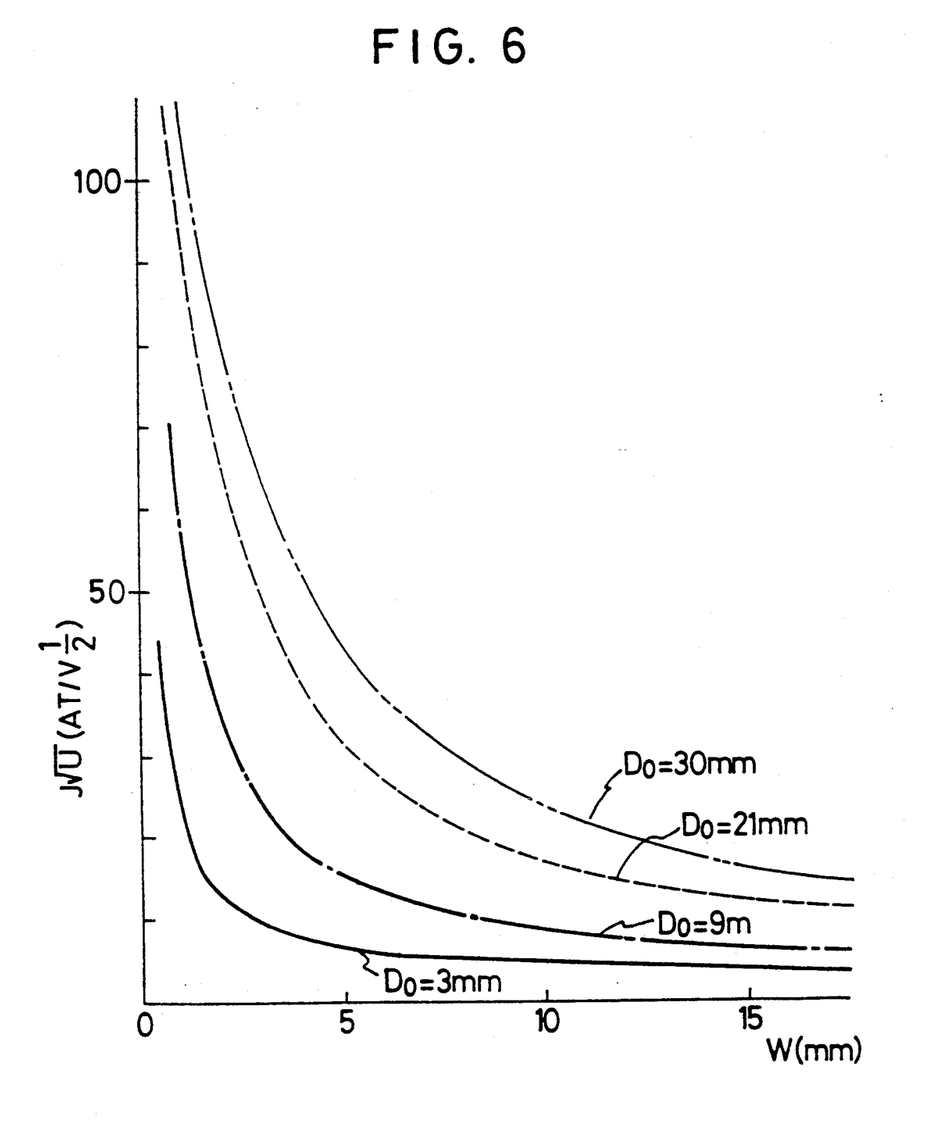
FIG. 6 is a characteristic diagram showing the relationship between working distance W and focusing magnetomotive force where the top face diameter $D_o$ of the single-pole lens is selected as a parameter.

FIG. 6 shows the focusing magnetomotive force $J/\sqrt{U}$ [AT/V$^{\frac{1}{2}}$] of the single-pole electromagnetic lens in relation to W with $D_o$ selected as a parameter. As will be appreciated, for W kept unchanged, the larger $D_o$, the larger the value of $J/\sqrt{U}$ becomes.

Figure 7:
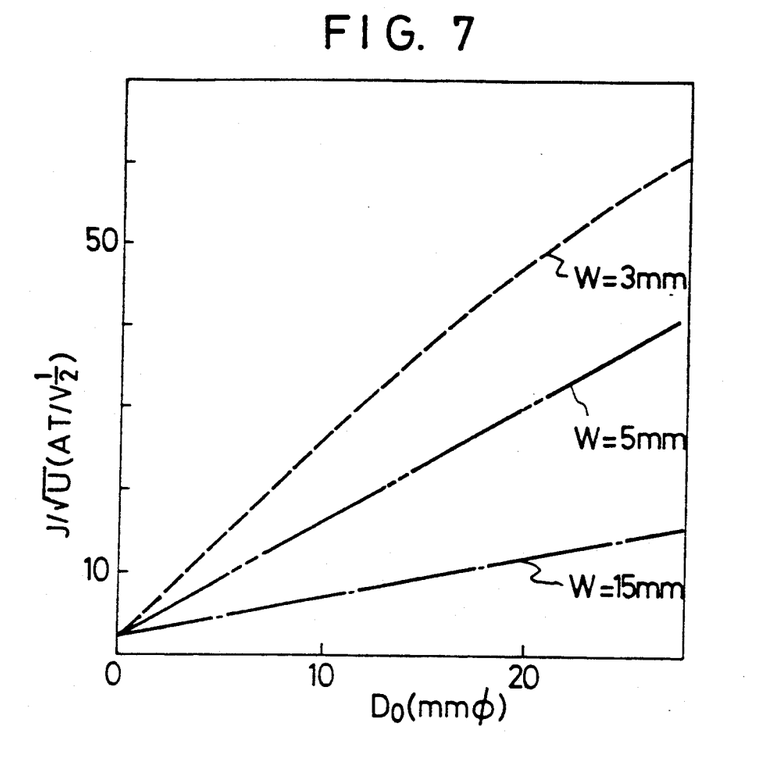
FIG. 7 is a characteristic diagram showing the relationship between top face diameter $D_o$ of the single-pole lens and focusing magnetomotive force where the working distance W is selected as a parameter.

FIG. 7 shows $J/\sqrt{U}$ in relation to $D_o$ with W selected as a parameter.

As will be appreciated from FIG. 7, where $D_o \leq 25$ mm, for W kept constant, $J/\sqrt{U}$ varies substantially linearly with $D_o$. Consequently, referring to FIG. 7, the focusing magnetomotive force is given by $$J/\sqrt{U} = 7.1(D_o/W) + 2.2 [AT/V^{\frac{1}{2}}] \quad (1)$$

Therefore, where $D_o \leq 25$ mm, the magnetomotive force required as well as the chromatic aberration coefficient $C_c$ can be made small.

Further, in practical lens systems, since a deflecting system is built into the inner cylinder and a yoke section must be prevented from magnetic saturation, the diameter $D_c$ of the inner cylinder of the single-pole electromagnetic lens should be made larger than the $D_o$ ($\leq 25$ mm), (it is usually set to 50 mm or more).

Accordingly, the top face $D_o$ must be connected with the cylindrical surface (of $D_c$ in diameter) of the inner cylinder by a conical surface, or with a cylinder of $D_o$ in diameter by a conical surface or a disc-shaped surface.

Figure 8:
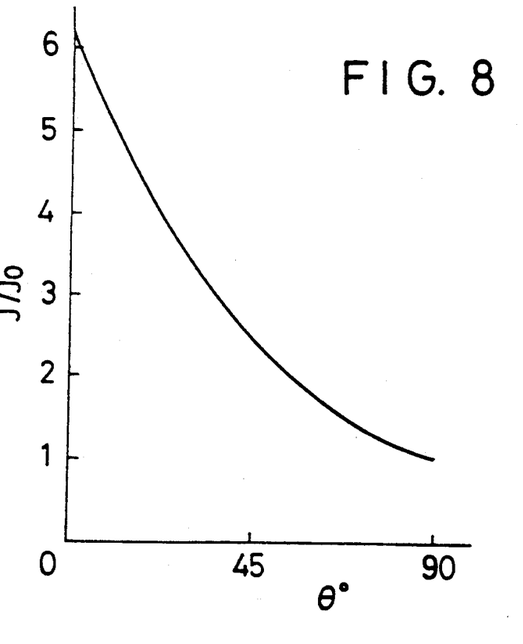
FIG. 8 is a characteristic diagram showing the ratio $J/J_o$ in relation to the angle of inclination of a cone where J is the magnetomotive force of a single-pole lens having a cylindrical surface and $J_o$ is that of a single-pole lens having a conical surface.
Figure 10:
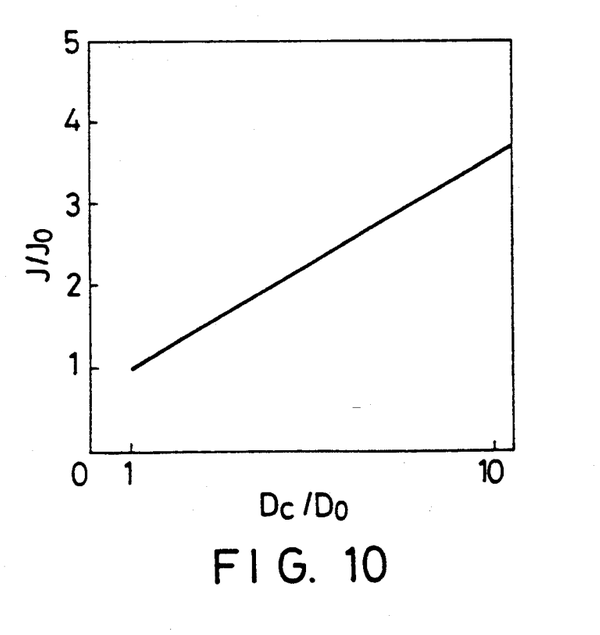
FIG. 10 is a characteristic diagram showing the ratio $J/J_o$ in relation to the ratio of the base portion diameter $D_c$ to the top face diameter $D_o$ of the single-pole lens.

It has been found that the foregoing provision of connection increases the focusing magnetomotive force $J/\sqrt{U}$ more than that obtained in accordance with Expression (1). FIG. 8 shows an example of the ratio $J/J_o$ where $J_o$ is the magnetomotive force of a single-pole electromagnetic lens ($\theta = 90°$) having a cylindrical top face surface of $D_o$ in diameter and $J$ is the magnetomotive force of a single-pole electromagnetic lens having a conical surface of $\theta$ ($< 90°$) whose top face diameter is $D_o$, with $D_c$ set to 90 mm. The larger $D_c$, the larger the value of $J$ becomes for the same configuration. As will be appreciated from FIG. 8, in the range where $\theta$ decreases from 45°, the value of J increases steeply. For a very large J, the objective lens undergoes magnetic saturation, resulting in electron-optically undesirable effects; therefore, this scheme is sometimes unpracticable. Through observation of the magnetic distribution, FIG. 10 shows the ratio $J/J_o$ with respect to $D_c/D_o$ where $J_o$ is the focusing magnetomotive force for $\theta = 45°$ and J is the magnetomotive force for $D_c = D_o$ ($\theta = 90°$). The following is derived from FIG. 10:

$$J/J_o = 0.29((D_c/D_o) - 1) + 1$$

Therefore, it will be clear that the focusing magnetomotive force of a single-pole electromagnetic lens having a conical surface ($45° \leq \theta \leq 90°$) which is connected to the cylindrical surface of an inner cylinder of $D_c$ in diameter on the side opposite to the side corresponding to the $D_o$ meets the relationship:

$$7.1(D_o/W) + 2.2 \leq J/\sqrt{U} \leq \{7.1(D_o/W) + 2.2\} \times \{0.29((D_c/D_o) - 1) + 1\}[AT/V^{\frac{1}{2}}] \quad (2)$$

Figure 1:
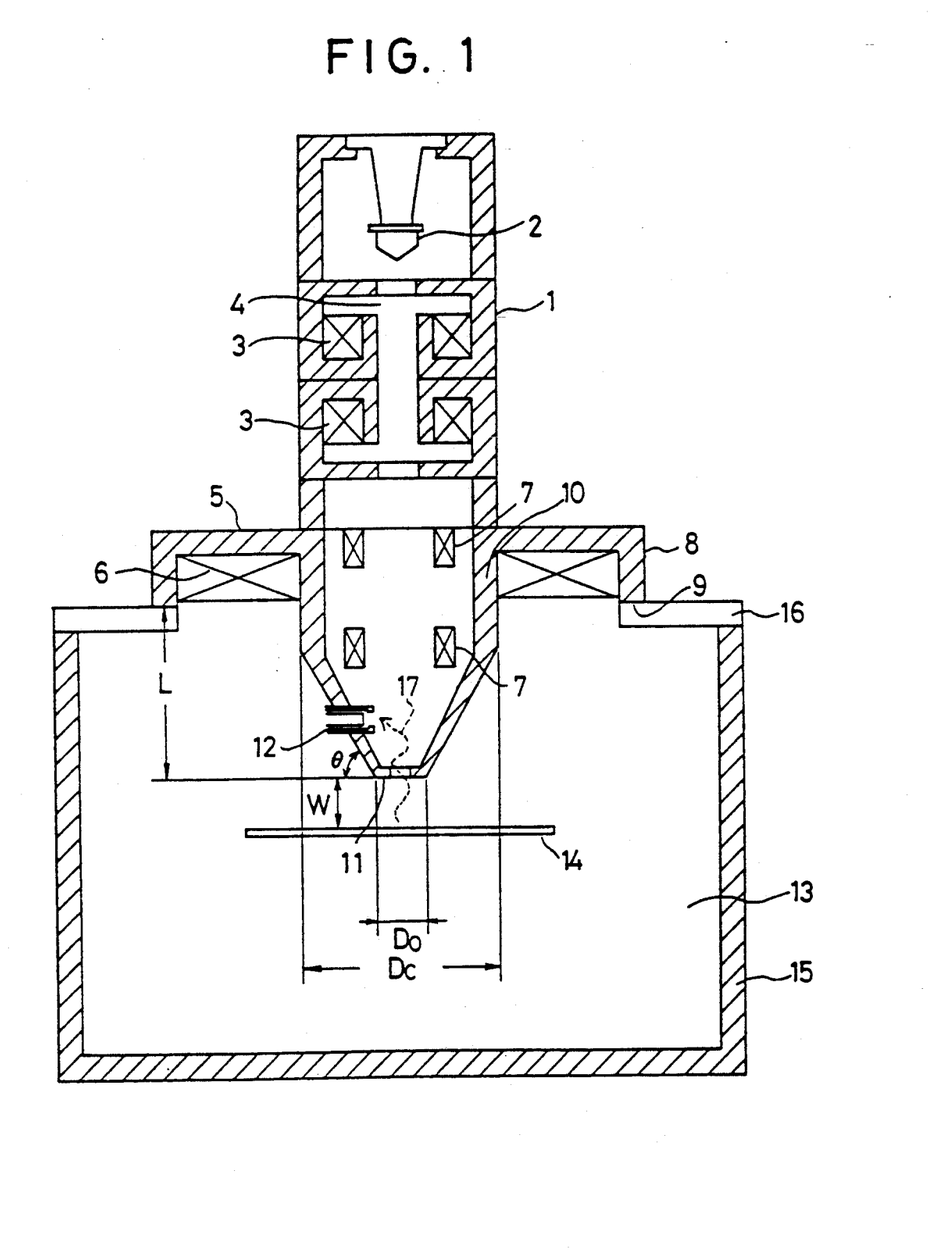
FIG. 1 is an elevational cross-sectional view showing an embodiment of the present invention.
Figure 9:
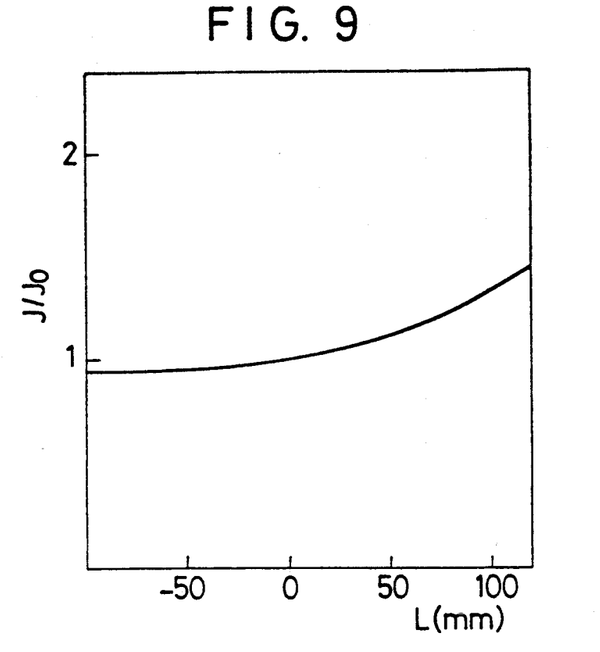
FIG. 9 is a characteristic diagram showing the ratio $J/J_o$ in relation to the distance L between the pole face of an outer cylinder and the pole top face of an inner cylinder of the single-pole lens.

FIG. 9 shows an example of the ratio $J/J_o$ in relation to the distance L, shown in FIG. 1, between the pole face 9 of the outer cylinder and the pole top face 11 of the inner cylinder where $D_c = 90$ mm and $\theta = 45°$. This diagram shows the focusing magnetomotive force where the pole face 9 of the outer cylinder and the pole top face 11 of the inner cylinder occupy the same plane. It is found that if the pole face 9 of the outer cylinder is retracted from the pole face 11 of the inner cylinder toward the electron source (L>O), the focusing magnetomotive force increases. L is not necessarily set large unless a large-size wafer is to be observed while keeping it in a largely inclined position. As will be appreciated from FIG. 9, if the pole face 9 of the outer cylinder is positioned midway between the position of a sample and a certain point spaced about 50 mm from the pole top face 11 of the inner cylinder toward the electron source, the percentage increase of J is suppressed to about 10% or less.

DESCRIPTION OF THE PREFERRED EMBODIMENTS

FIG. 1 shows an embodiment of the present invention. The electron beam device 1 of the present invention comprises an electron gun 2, a converging lens 3, a single-pole electromagnetic objective lens 5, and a sample chamber 13. The single-pole electromagnetic objective lens 5 is arranged such that the pole top, or end, face 11 of an inner member 10 is aligned with the electron beam axis 4 and positioned in front of a sample 14 as viewed from the side of an electron beam source. A secondary-electron detector 12 and a two-stage scanning coil 7 are provided at the upper side of the pole top face 11 as illustrated. The electron beams emitted from the electron gun 2 are converged by the converging lens 3, focused on the sample 14 by the single-pole electromagnetic objective lens 5, and deflected by the scanning coil 7 to scan the sample 14. Secondary electrons 17 emitted from the sample 14, after passing through a hole formed in the pole top face 11, are detected by the secondary-electron detector 12.

The inner member 10 has a conical surface portion whose inclination angle $\theta$ is 45 degrees or more. This conical surface portion is connected to a cylindrical surface portion of inner member 10 of $D_c$ in diameter.

The diameter $D_o$ of the pole top face 11 and the diameter $D_c$ of the cylindrical surface of the inner member 10 of the single-pole electromagnetic objective lens 5 are set as to meet the relationship: $D_o \leq 25 \text{ mm} \leq D_c$.

The pole face 9 of an outer cylinder 8 is positioned in the vicinity of the pole top face of the inner member and connected through a non-magnetic member 16 to the sample chamber 13 made of magnetic material (this configuration is disclosed in Japanese Patent Application No. 63-279987 of the present applicant).

The sample 14, which can be of large size, is disposed with $W \leq 6$ mm.

The single-pole electromagnetic objective lens 5 is excited by energizing the coil 6 thereof. The magnetomotive force J (the current flowing through the coil multiplied by the number of coil turns) of the lens 5 is determined considering the position W of the sample, the diameter $D_o$ of the pole top face, the diameter $D_c$ of the cylindrical surface of the inner member, the inclination angle $\theta$ of the conical surface, and the distance L between the pole face 9 of the outer cylinder 8 and the pole top face 11 of the inner member 10.

As described above, the focusing magnetomotive force $J/\sqrt{U}$ is set larger than that given by Expression (1), and the bundle of electron beams passed through the converging lens 3 is focused on the sample 4 spaced the distance W from the pole top face 11 of the inner member 10 by the action of the single-pole electromagnetic objective lens 5 having the foregoing magnetomotive force.

Figure 11:
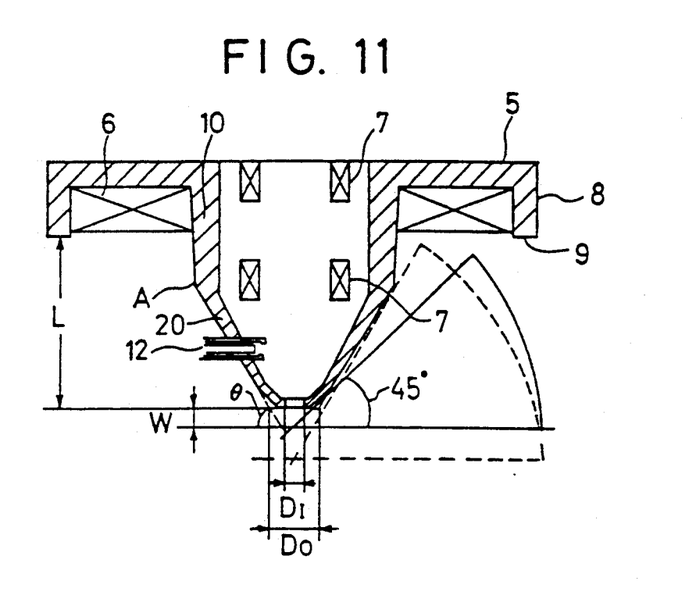
FIG. 11 is a sectional view showing a modification of the single-pole electromagnetic objective lens used in the present invention.

The inner member 10 of the single-pole electromagnetic objective lens 5 may be shaped as shown in FIG. 11. In this drawing, an inclined surface 20 whose inclination angle is about 60 degrees, for example, is provided between the conical surface ($\theta = 45°$) and the cylindrical surface of the inner member. As can be deduced from FIG. 8, this configuration can decrease the magnetomotive force J. Further, by making a base portion of the cylindrical surface of the inner member 10 slightly oblique, i.e. by prolonging the outer surface of the conical surface portion, to increase the sectional area of a yoke as illustrated at A in FIG. 11, a bottom portion of the inner member 10 hardly undergoes magnetic saturation, with the result that a larger magnetomotive force can be exerted. In this embodiment, $D_o$ is the diameter of a circle defined by the intersection of a cone coincident with inclined surface 20 and a plane coincident with the pole top face.

Figure 12:
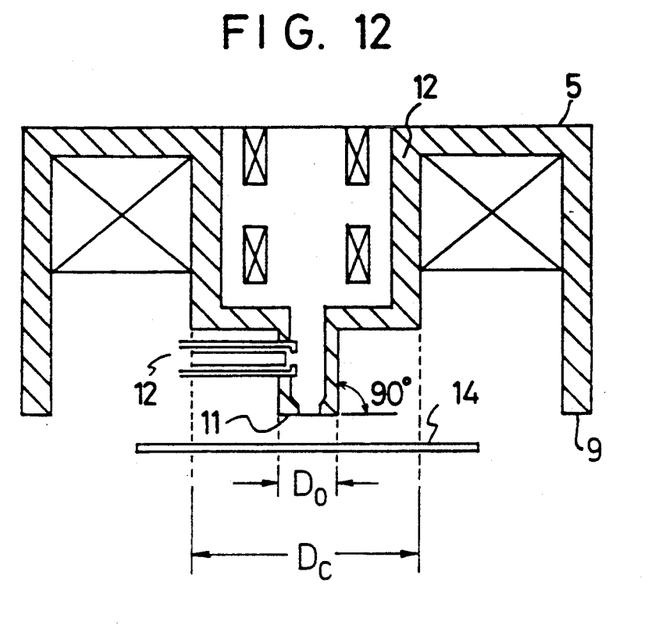
FIG. 12 is a sectional view showing another modification of the single-pole electromagnetic objective lens used in the present invention.

FIG. 12 shows the case of $\theta = 90°$. In this drawing, a cylinder having a diameter $D_o$ of adequate size and a diameter $D_c$ larger than $D_o$ are connected together by a disc-shaped surface. This surface may also be cone-shaped.

Where $D_o = 15$ mm, $\theta = 45°$, $D_c = 100$ mm, the diameter of the hole in the pole top face is 5 mm, the pole face 9 of the outer cylinder and the pole top face 11 of the inner cylinder occupy the same plane, and $W = 6$ mm, there result $C_c = 3.6$ mm and $J/\sqrt{U} = 37[\text{AT}/\text{V}^{\frac{1}{2}}]$, and the resolving power is estimated at 3.8 mm for 1 KV from FIG. 3.

Figure 13:
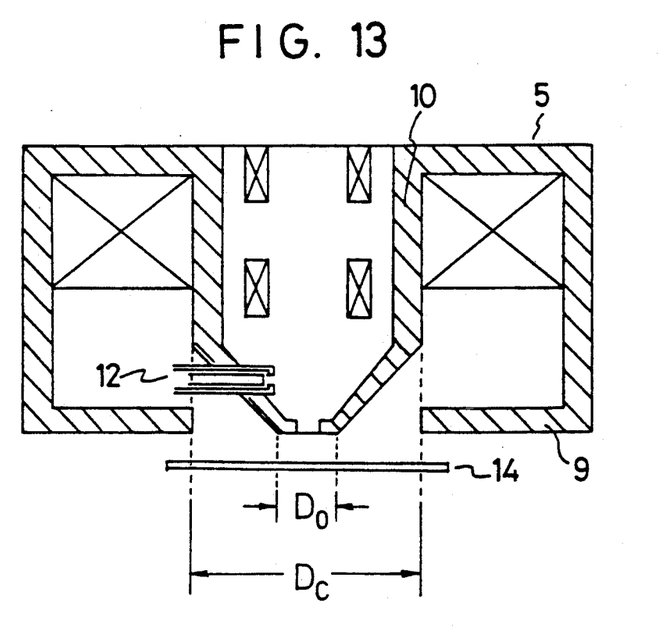
FIG. 13 is a sectional view showing still another modification of the single-pole electromagnetic objective lens used in the present invention.

FIG. 13 shows a modification of the single-pole electromagnetic objective lens 5 in which the pole end face 9 of the outer cylinder projects inward. This kind of lens prevents any magnetic flux from leaking outward.

The foregoing electron beam device of the present invention makes it possible to survey a sample with a resolving power corresponding to a dimension about one-half that of the prior art under low accelerating voltage conditions.

This application relates to subject matter disclosed in Japanese Application number 2-339753, filed on Nov. 30, 1990, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. An electron beam device comprising: an electron beam source; means defining a sample holding location in the path of an electron beam produced by said source; a single-pole electromagnetic objective lens having an electron beam axis and composed of a focusing coil and an inner member having a distal end provided with a pole end face which is disposed between said beam source and said sample holding location, said inner member having a base portion of circular cross section and a cylindrical or conical intermediate portion which extends between said pole end face and said base portion and is joined to said base portion at an annular meeting plane having an outer diameter $D_c$, said pole end face having a circular outer periphery with a diameter $D_o$, said objective lens being further composed of an outer cylinder which surrounds said inner member and which has a pole face; and a secondary-electron detector mounted for detecting secondary electrons which enter said inner member via said pole end face; wherein:

$D_o < 25 \text{ mm} < D_c$;

the pole end face forms an angle $\theta$ with the conical or cylindrical intermediate portion of said inner member such that:

$45° \leq \theta \leq 90°$ said pole face of said outer cylinder is arranged midway between said sample holding location and a point spaced 50 mm from said pole end face of said inner member toward said electron beam source in the direction of said electron beam axis, the distance W between the sample holding location and the pole end face satisfies the relationship:

$W \leq 6 \text{ mm}$ and for an accelerating voltage U, the focusing magnetomotive force $J/\sqrt{U}$ for focusing an electron beam on a sample at the sample holding location satisfies the relationship:

$$7.1(D_o/W) + 2.2 \leq J/\sqrt{U} \leq (7.1(D_o/W) + 2.2) \times$$
$$(0.29(D_c/D_o - 1) + 1),$$

where J is the product of the current through said focusing coil, in amperes, and the number of turns in said focusing coil, and U is in units of volts.

2. An electron beam device according to claim 1 wherein said intermediate portion is conical and said base portion has an outer peripheral surface with a region adjacent said intermediate portion which is tapered to be continuous with, and extends at the same inclination as, said intermediate portion.

3. An electron beam device according to claim 1 wherein said intermediate portion has an outer surface with two sections which follow one another along the electron beam axis, one of the sections is closer to said pole end face than is the other section, and said one section forms a smaller angle with said pole end face than does said other section.

4. An electron beam device according to claim 3 wherein said intermediate portion is conical and said base portion has an outer peripheral surface with a region adjacent said intermediate portion which is tapered to be continuous with, and extends at the same inclination as, said intermediate portion.

* * * * *